(12) United States Patent
Yoon

(10) Patent No.: US 12,646,554 B2
(45) Date of Patent: Jun. 2, 2026

(54) MEMORY AND OPERATION METHOD THEREOF

(71) Applicant: SK hynix Inc., Gyeonggi-do (KR)

(72) Inventor: Sang Woo Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 91 days.

(21) Appl. No.: 18/945,527

(22) Filed: Nov. 13, 2024

(65) Prior Publication Data

US 2025/0069639 A1 Feb. 27, 2025

Related U.S. Application Data

(63) Continuation of application No. 17/980,141, filed on Nov. 3, 2022, now Pat. No. 12,190,935.

(30) Foreign Application Priority Data

May 24, 2022 (KR) ........................ 10-2022-0063514

(51) Int. Cl.
| | |
|---|---|
| *G11C 11/406* | (2006.01) |
| *G06F 3/06* | (2006.01) |
| *G11C 11/4078* | (2006.01) |
| *G11C 11/408* | (2006.01) |
| *G11C 11/4091* | (2006.01) |
| *G11C 11/4094* | (2006.01) |
| *G11C 29/12* | (2006.01) |

(52) U.S. Cl.
CPC ...... *G11C 11/40615* (2013.01); *G06F 3/0619* (2013.01); *G06F 3/0653* (2013.01); *G06F 3/0673* (2013.01); *G11C 11/40603* (2013.01); *G11C 11/40611* (2013.01); *G11C 11/4078* (2013.01); *G11C 11/408* (2013.01); *G11C 11/4087* (2013.01); *G11C 11/4091* (2013.01); *G11C 11/4094* (2013.01); *G11C 29/1201* (2013.01); *G11C 2029/1204* (2013.01)

(58) Field of Classification Search
CPC ........ G11C 11/40615; G11C 11/40603; G11C 11/40611; G11C 11/4078; G11C 11/408; G11C 11/4087; G11C 11/4091; G11C 11/4094; G11C 29/1201; G11C 2029/1204; G06F 3/0619; G06F 3/0653; G06F 3/0673
USPC .................... 714/719, 718, 365, 222, 185.25
See application file for complete search history.

(56) References Cited

U.S. PATENT DOCUMENTS

| | | | | | |
|---|---|---|---|---|---|
| 5,654,912 | A | * | 8/1997 | Hasegawa | ........... G11C 11/4096 365/189.12 |
| 7,215,595 | B2 | * | 5/2007 | Kiehl | ........................ G11C 7/12 365/208 |
| 7,684,275 | B2 | * | 3/2010 | Yun | .......................... G11C 7/06 365/208 |

(Continued)

*Primary Examiner* — John J Tabone, Jr.
(74) *Attorney, Agent, or Firm* — IP & T GROUP LLP

(57) ABSTRACT

An operation method of a memory may include receiving an active command and an active address; determining whether a row corresponding to the active address and a row corresponding to a target row address are able to be substantially simultaneously activated; activating the row corresponding to the active address; and activating the row corresponding to the target row address in response to determining that the row corresponding to the active address and the row corresponding to the target row address are able to be substantially simultaneously activated.

16 Claims, 5 Drawing Sheets

(56)                References Cited

U.S. PATENT DOCUMENTS

| | | | |
|---|---|---|---|
| 9,190,138 B2 * | 11/2015 | Song | G11C 7/02 |
| 10,755,766 B2 * | 8/2020 | Hush | G11C 11/4091 |
| 10,861,519 B2 * | 12/2020 | Jones | G11C 11/406 |
| 10,902,902 B2 * | 1/2021 | Son | G11C 11/40611 |
| 10,916,293 B1 * | 2/2021 | Lai | G11C 11/40607 |
| 12,190,935 B2 * | 1/2025 | Yoon | G11C 11/408 |
| 2002/0093864 A1 * | 7/2002 | Ooishi | G11C 7/18 |
| | | | 365/222 |
| 2003/0156486 A1 * | 8/2003 | Tanaka | G11C 11/4091 |
| | | | 365/230.03 |
| 2006/0004955 A1 * | 1/2006 | Ware | G11C 11/406 |
| | | | 365/222 |
| 2006/0109731 A1 * | 5/2006 | Suh | G11C 11/4097 |
| | | | 365/230.03 |
| 2006/0215472 A1 * | 9/2006 | Yoon | G11C 11/4097 |
| | | | 365/207 |
| 2008/0186782 A1 * | 8/2008 | Yun | G11C 7/18 |
| | | | 365/189.15 |
| 2008/0192560 A1 * | 8/2008 | Lee | G11C 16/0483 |
| | | | 365/230.03 |
| 2009/0273961 A1 * | 11/2009 | Ono | G11C 13/00 |
| | | | 365/189.011 |
| 2014/0006703 A1 * | 1/2014 | Bains | G06F 3/0619 |
| | | | 711/106 |
| 2015/0155030 A1 * | 6/2015 | Song | G11C 11/40618 |
| | | | 365/222 |
| 2015/0279443 A1 * | 10/2015 | Park | G11C 11/40618 |
| | | | 365/189.05 |
| 2015/0340077 A1 * | 11/2015 | Akamatsu | G11C 5/063 |
| | | | 365/96 |
| 2016/0042782 A1 * | 2/2016 | Narui | G11C 11/406 |
| | | | 365/222 |
| 2019/0228810 A1 * | 7/2019 | Jones | G11C 11/40611 |
| 2021/0151095 A1 * | 5/2021 | Nale | G11C 11/4096 |
| 2021/0287736 A1 * | 9/2021 | Park | G11C 5/005 |
| 2023/0170009 A1 * | 6/2023 | Bang | G11C 11/40615 |
| | | | 365/103 |
| 2023/0384942 A1 * | 11/2023 | Yoon | G06F 3/0673 |
| 2025/0069639 A1 * | 2/2025 | Yoon | G11C 11/40615 |

* cited by examiner

FIG. 2

MEMORY AND OPERATION METHOD THEREOF

CROSS-REFERENCE TO RELATED APPLICATION

This application is a continuation of U.S. patent application Ser. No. 17/980,141 filed on Nov. 3, 2022, which claims priority under 35 U.S.C. § 119 to Korean Patent Application No. 10-2022-0063514 filed on May 24, 2022, which is incorporated herein by reference in its entirety.

BACKGROUND

1. Field

Embodiments of the present disclosure relate to a memory.

2. Discussion of the Related Art

As the degree of integration of a memory increases, the spacing between a plurality of word lines included in the memory is decreasing. As the spacing between the word lines decreases, a coupling effect between adjacent word lines is increasing.

On the other hand, whenever data is inputted to/outputted from a memory cell, a word line toggles between an activated (active) state and a deactivated state. As the coupling effect between adjacent word lines increases as described above, there occurs a phenomenon in which data in a memory cell connected to a word line adjacent to a frequently activated word line is damaged. Such a phenomenon is called row hammering, and the data in the memory cell is damaged due to word line disturbance before the memory cell is refreshed, which may be an issue.

FIG. 1 is a diagram for describing row hammering and is a diagram illustrating a part of a cell array included in a memory.

In FIG. 1, 'WLL' corresponds to a word line having a large number of activations, and 'WLL−1' and 'WLL+1' correspond to word lines disposed adjacent to 'WLL', that is, word lines each having the number of activations closer to that of the word line. 'CL' denotes a memory cell connected to 'WLL', 'CL−1' denotes a memory cell connected to 'WLL−1', and 'CL+1' denotes a memory cell connected to 'WLL+1'. The memory cell 'CL' includes a cell transistor TL and a cell capacitor CAPL, the memory cell 'CL−1' includes a cell transistor TL−1 and a cell capacitor CAPL−1, and the memory cell 'CL+1' includes a cell transistor TL+1 and a cell capacitor CAPL+1.

In FIG. 1, when 'WLL' is activated or deactivated, voltages of 'WLL−1' and 'WLL+1' rise or fall due to a coupling phenomenon occurring between 'WLL' and 'WLL−1'/'WLL+1', and the amount of charge in the cell capacitors CAPL−1 and CAPL+1 is also affected. Therefore, when 'WLL' is frequently activated and toggles between an activated state and a deactivated state, a change in the amount of charge stored in the cell capacitors CAPL−1 and CAPL+1 included in 'CL−1' and 'CL+1' may increase and data in the memory cell may deteriorate.

Furthermore, electromagnetic waves generated while the word line toggles between an activated state and a deactivated state may damage data by introducing electrons into a cell capacitor of a memory cell connected to an adjacent word line or discharging electrons from the cell capacitor.

A method for solving row hammering, includes a method of finding a row (word line) activated multiple times and refreshing peripheral rows of the row activated multiple times is mainly used.

SUMMARY

Various embodiments of the present disclosure may more frequently refresh memory cells having a high probability of data loss due to row hammering.

An operation method of a memory in accordance with an embodiment of the present disclosure may include: receiving an active command and an active address; determining whether a row corresponding to the active address and a row corresponding to a target row address are able to be substantially simultaneously activated; activating the row corresponding to the active address; and activating the row corresponding to the target row address in response to determining that the row corresponding to the active address and the row corresponding to the target row address are able to be substantially simultaneously activated.

A memory in accordance with an embodiment of the present disclosure may include: a target row refresh operation control circuit configured to determine whether to perform a target row refresh operation during an active operation; a target row collection circuit configured to collect a target row address corresponding to a target row, on which the target row refresh operation is to be performed; and a memory core including memory cells arranged in a plurality of rows and a plurality of columns and configured to activate rows respectively corresponding to an active address and the target row address when it is determined to perform the target row refresh operation during the active operation.

The target row refresh operation control circuit may determine to perform the target row refresh operation when the necessity of performing the target row refresh operation and the possibility of performing the target row refresh operation are satisfied.

A memory in accordance with an embodiment of the present disclosure may include: memory cell arrays, neighboring ones of which share a corresponding one of bit line sense amplifier arrays coupled to columns of the respective memory cell arrays; a data transfer circuit configured to exchange data with an exterior; switch arrays each configured to couple, when activated, the data transfer circuit to at least one of bit line sense amplifiers within a corresponding one of the bit line sense amplifier arrays; and a control circuit configured to: activate, during an active operation, first and second rows of respective first and second memory cell arrays that do not neighbor with each other among the memory cell arrays; and access the activated first row by activating a first switch array while deactivating a second switch array, the first and second switch arrays respectively corresponding to the first and second memory cell arrays.

According to embodiments of the present disclosure, memory cells each having a high probability of data loss due to row hammering may be frequently refreshed.

BRIEF DESCRIPTION OF THE DRAWINGS

FIG. 2 is a configuration diagram of a memory in accordance with an embodiment of the present disclosure.

DETAILED DESCRIPTION

Figure 1:
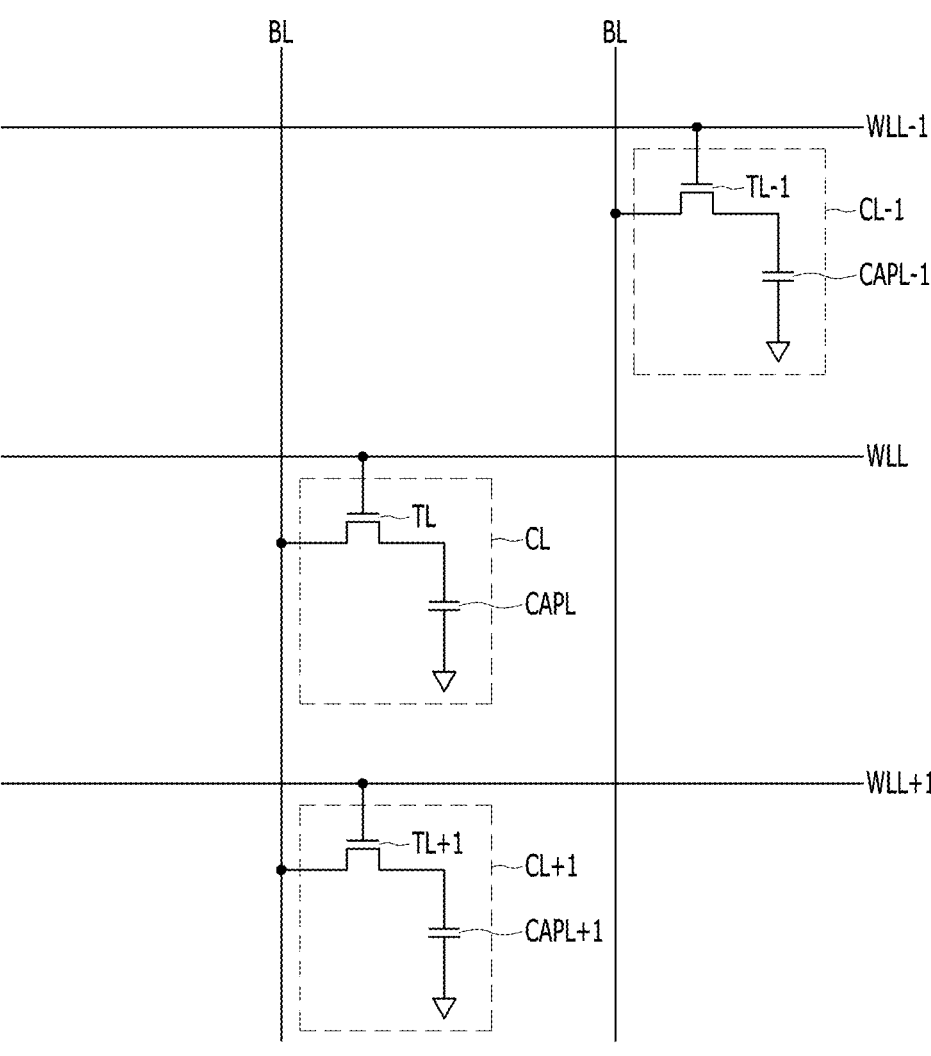
FIG. 1 is a diagram for describing row hammering and is a diagram illustrating a part of a cell array included in a memory in accordance with an embodiment of the present disclosure.

Hereinafter, in order to describe in detail the present disclosure for a person skilled in the art to which the present disclosure pertains to be able to easily carry out the technical idea of the present disclosure, embodiments of the present disclosure will be described with reference to the accompanying drawings. In describing the present disclosure, publicly-known configurations irrelevant to the subject matter of the present disclosure may be omitted. In adding reference numerals to components of each drawing, it should be noted that only the same components are given the same reference numerals if possible even though they are illustrated in different drawings.

Figure 2:
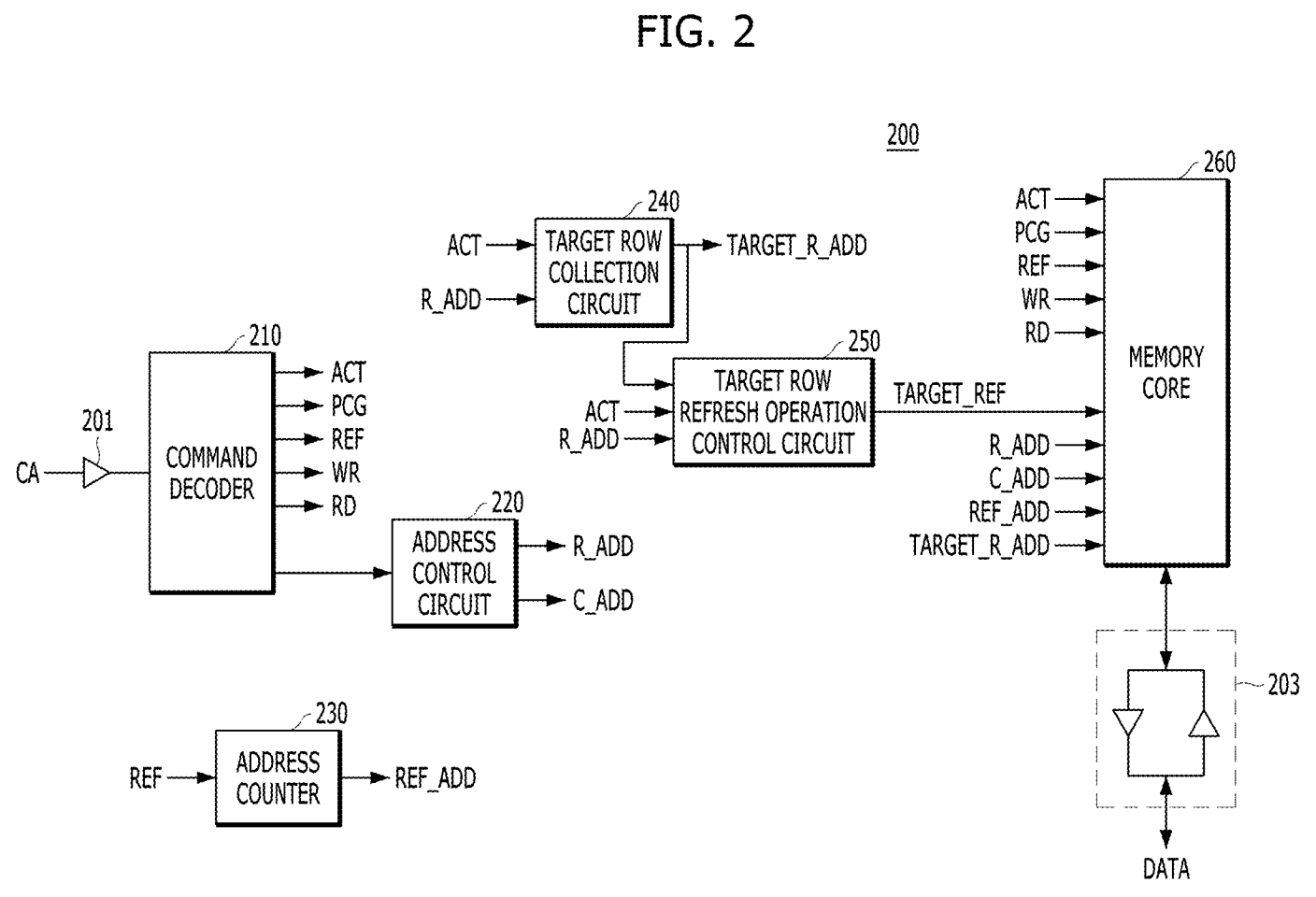

FIG. 2 is a configuration diagram of a memory 200 in accordance with an embodiment of the present disclosure.

Referring to FIG. 2, the memory 200 may include a command address reception circuit 201, a data transmission/reception circuit 203, a command decoder 210, an address control circuit 220, an address counter 230, a target row collection circuit 240, a target row refresh operation control circuit 250, and a memory core 260.

The command address reception circuit 201 may receive a command and an address CA. Depending on the type of the memory 200, a command and an address may be also inputted to substantially the same input terminals and may be also inputted to separate input terminals. The present embodiment shows an example in which a command and an address are inputted to substantially the same input terminals. The command and the address CA may be multi-bits.

The data transmission/reception circuit 203 may receive data DATA or transmit the data DATA. The data transmission/reception circuit 203 may receive the data DATA to be written to the memory core 260 during a write operation, and transmit the data DATA read from the memory core 260 during a read operation.

The command decoder 210 may decode the command and the address CA, find out the type of operation instructed by a memory controller to the memory 200, and generate internal command signals ACT, PCG, REF, WR, and RD. An active signal ACT may be a signal that is activated when an active operation is instructed, and a precharge signal PCG may be a signal that is activated when a precharge operation is instructed. A refresh signal REF may be a signal that is activated when a refresh operation is instructed. A write signal WR may be a signal that is activated when a write operation is instructed, and a read signal RD may be a signal that is activated when a read operation is instructed.

The address control circuit 220 may classify addresses received from the command decoder 210 into a row address R_ADD and a column address C_ADD. The address control circuit 220 may classify an address, which is received when an active operation is instructed as a result of decoding by the command decoder 210, into the row address R_ADD, and classify an address, which is received when read and write operations are instructed, into the column address C_ADD.

The address counter 230 may generate a refresh address REF_ADD that is a row address used for a refresh operation. The address counter 230 may change the refresh address REF_ADD by +1 whenever the refresh signal REF is activated. Since the refresh address REF_ADD is changed whenever the refresh signal REF is activated, rows of the memory core 260 may be sequentially refreshed.

The target row collection circuit 240 may collect information on a row (hereinafter, referred to as a target row), in which data is highly likely to be lost due to row hammering in the memory core 260, and provide the collected information as a target row address TARGET_R_ADD. The target row collection circuit 240 may select a row which is adjacent to a row activated excessively multiple times, as a target row, and select the target row by using a combination of various methods such as a method of counting the number of times by which rows of the memory core 260 are activated and a method of randomly sampling rows activated in the memory core 260. The target row collection circuit 240 may monitor the activation of the rows of the memory core 260 by using the active signal ACT and the row address R_ADD.

The target row refresh operation control circuit 250 may determine whether to perform a target row refresh operation together with an active operation, in which the active signal ACT is activated, during the active operation. The target row refresh operation may refer to an operation of refreshing a row corresponding to the target row address TARGET_R_ADD provided by the target row collection circuit 240. The target row refresh operation control circuit 250 may determine to perform the target row refresh operation and activate a target row refresh signal TARGET_REF when the need of performing the target row refresh operation and the possibility of performing the target row refresh operation are satisfied.

The target row refresh operation control circuit 250 may determine the need of performing the target row refresh operation according to the presence or absence of the target row address TARGET_R_ADD collected by the target row collection circuit 240. This is because it is not needed to perform the target row refresh operation when there is no target row address TARGET_R_ADD collected by the target row collection circuit 240, that is, when there is no row in which data is likely to be lost due to row hammering. Since the active operation in the memory 200 is an operation that is very frequently performed and the target row refresh operation does not need to be performed as frequently as the active operation, the target row refresh operation control circuit 250 may also determine the need of performing the target row refresh operation according to the presence or absence of the target row address TARGET_R_ADD collected by the target row collection circuit 240 whenever the active operation is performed N times, where N is an integer equal to or greater than 2.

The target row refresh operation control circuit 250 may determine the possibility of performing the target row refresh operation, by using the row address R_ADD, that is, an active address used for the active operation and the target row address TARGET_R_ADD. When there is a bit line sense amplifier shared by a row corresponding to an active address R_ADD and a row corresponding to the target row address TARGET_R_ADD, an active operation of a row corresponding to the row address R_ADD and a refresh operation (that is, an active operation) of a row corresponding to the target row address TARGET_R_ADD may not be simultaneously performed, which will be described in more detail with reference to FIG. 3.

The memory core 260 may include a plurality of memory cells arranged in a plurality of rows and a plurality of columns, and various circuits for controlling the operation of the plurality of memory cells. When the active signal ACT is activated, a row selected by the row address R_ADD among the rows of the memory core 260 may be activated. When the precharge signal PCG is activated, the activated row may be deactivated. When the write signal WR is activated, data may be written to columns selected by the column address C_ADD among the columns of the memory core 260, and when the read signal RD is activated, data may be read from columns selected by the column address C_ADD among the columns of the memory core 260. When the refresh signal REF is activated, a row selected by the refresh address REF_ADD among the rows of the memory core 260 may be refreshed. Furthermore, when the target row refresh signal TARGET_REF is activated during an active operation, a row selected by the target row address TARGET_R_ADD may be activated together with a row selected by the row address R_ADD.

Figure 3:
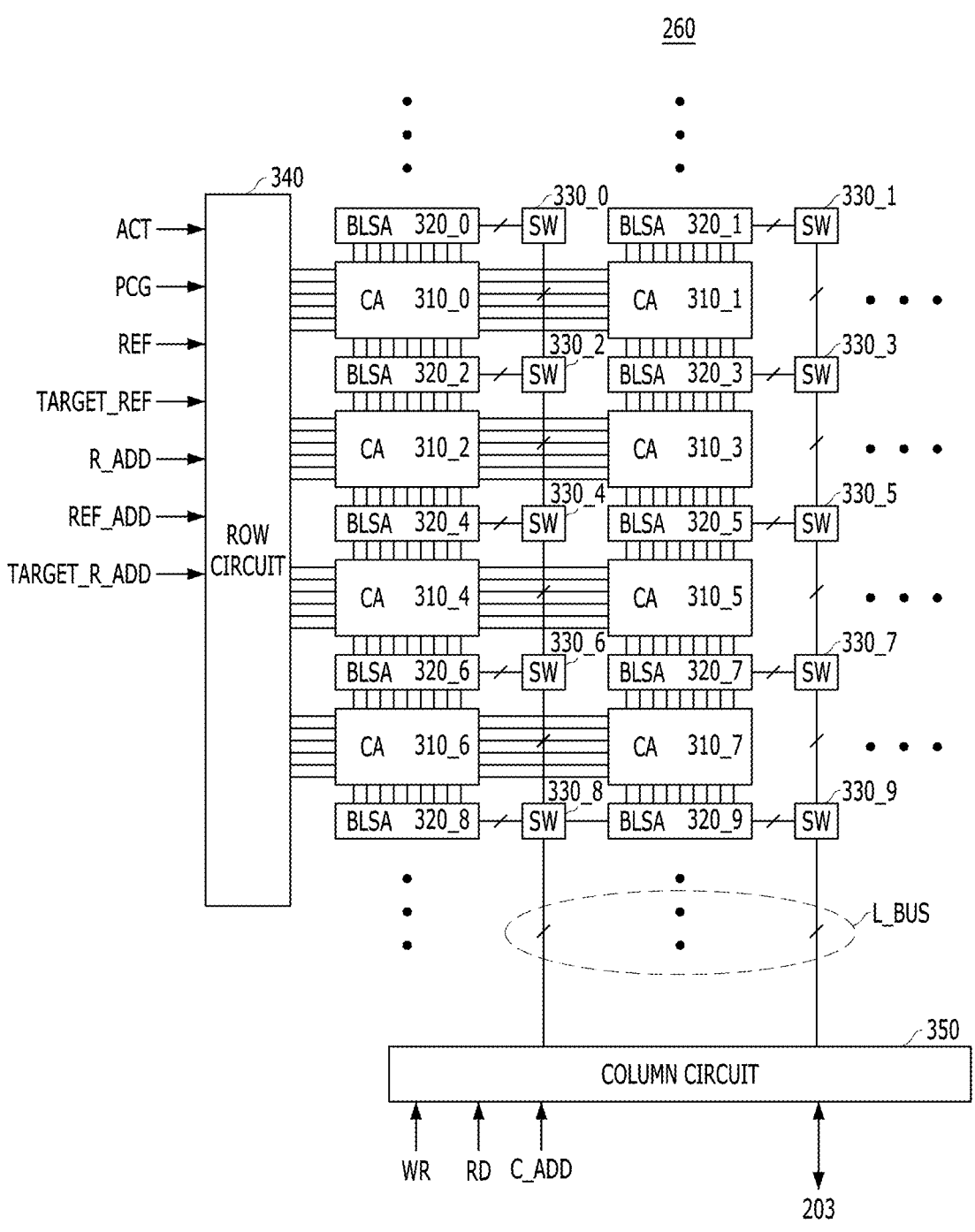
FIG. 3 is a configuration diagram of the memory core in FIG. 2 in accordance with an embodiment of the present disclosure.

FIG. 3 is a configuration diagram of the memory core 260 in FIG. 2 in accordance with an embodiment of the present disclosure.

Referring to FIG. 3, the memory core 260 may include cell arrays 310_0 to 310_7, bit line sense amplifier arrays 320_0 to 320_9, bus switch arrays 330_0 to 330_9, a row circuit 340, and a column circuit 350. FIG. 3 illustrates the configuration of one memory bank and the memory may include a plurality of memory banks.

Each of the cell arrays 310_0 to 310_7 may include a plurality of memory cells arranged in a plurality of row and a plurality of columns. Each of the bit line sense amplifier arrays 320_0 to 320_9 may include bit line sense amplifiers for sensing and amplifying data stored in the cell arrays 310_0 to 310_7. Data of rows selected from the cell arrays 310_0 to 310_7 may be sense-amplified by the bit line sense amplifier arrays 320_0 to 320_9 located at upper and lower ends of the cell arrays 310_0 to 310_7. For example, when rows of the cell arrays 310_0 and 310_1 are selected and activated, data of the memory cells of the rows selected from the cell arrays 310_0 and 310_1 may be sense-amplified by the bit line sense amplifier arrays 320_0 to 320_3. Similarly, when rows of the cell arrays 310_2 and 310_3 are selected and activated, data of the memory cells of the rows selected from the cell arrays 310_2 and 310_3 may be sense-amplified by the bit line sense amplifier arrays 320_2 to 320_5.

The bus switch arrays 330_0 to 330_9 may electrically connect a local bus L_BUS and some bit line sense amplifiers selected within the bit line sense amplifier arrays 320_0 to 320_9. For example, the bus switch array 330_2 may electrically connect some bit line sense amplifiers selected from the bit line sense amplifier array 320_2 by the column address C_ADD.

The row circuit 340 may activate a row selected by the row address R_ADD when the active signal ACT is activated. The row circuit 340 may refresh a row selected by the refresh address REF_ADD when the refresh signal REF is activated. Furthermore, when the target row refresh signal TARGET_REF is activated together with the active signal ACT, the row circuit 340 may activate a row selected by the target row address TARGET_R_ADD together with the row selected by the row address R_ADD. That is, when the target row refresh signal TARGET_REF is activated, two rows may be activated in the memory core 260. The row circuit 340 may deactivate an activated row when the precharge signal PCG is activated.

When the read signal RD is activated, the column circuit 350 may control the bus switch arrays 330_0 to 330_9 so that data may be read from memory cells of columns selected by the column address C_ADD in an activated row, and transmit, to the data transmission/reception circuit 203, data transmitted through the local bus L_BUS. Furthermore, when the write signal WT is activated, the column circuit 350 may control the bus switch arrays 330_0 to 330_9 so that data may be written to memory cells of columns selected by the column address C_ADD in the activated row, and transmit, to the local bus L_BUS, data transmitted from the data transmission/reception circuit 203. The activated row to be subjected to the read and write operations means a row corresponding to the row address R_ADD and does not mean a row corresponding to the target row address TARGET_R_ADD. That is, data input/output may be performed in a row selected and activated by the row address R_ADD, but may not be performed in a row selected and activated by the target row address TARGET_R_ADD.

With reference to FIG. 3, a criterion by which the target row refresh operation control circuit 250 determines the possibility of performing the target row refresh operation will be described. Two rows may not be activated in cell arrays that share a bit line sense amplifier array. When one row is activated in the cell arrays 310_2 and 310_3, a row may not be further activated in the cell arrays 310_0 to 310_5 that share at least a part of the bit line sense amplifier arrays 320_2 to 320_5 used by the cell arrays 310_2 and 310_3. However, since the cell arrays 310_6 and 310_7 do not use the bit line sense amplifier arrays 320_2 to 320_5, one row may be further activated in the cell arrays 310_6 and 310_7. Similarly, when one row is activated in the cell arrays 310_0 and 310_1, a row may not be further activated in the cell arrays 310_0 to 310_3, but one row may be further activated in the cell arrays 310_4 to 310_7.

In a state in which a row selected by the active address R_ADD is activated, when a row selected by the target row address TARGET_R_ADD may be further activated, the target row refresh operation control circuit 250 may determine that it is possible to perform the target row refresh operation, and if not, the target row refresh operation control circuit 250 may determine that it is not possible to perform the target row refresh operation.

Figure 4:
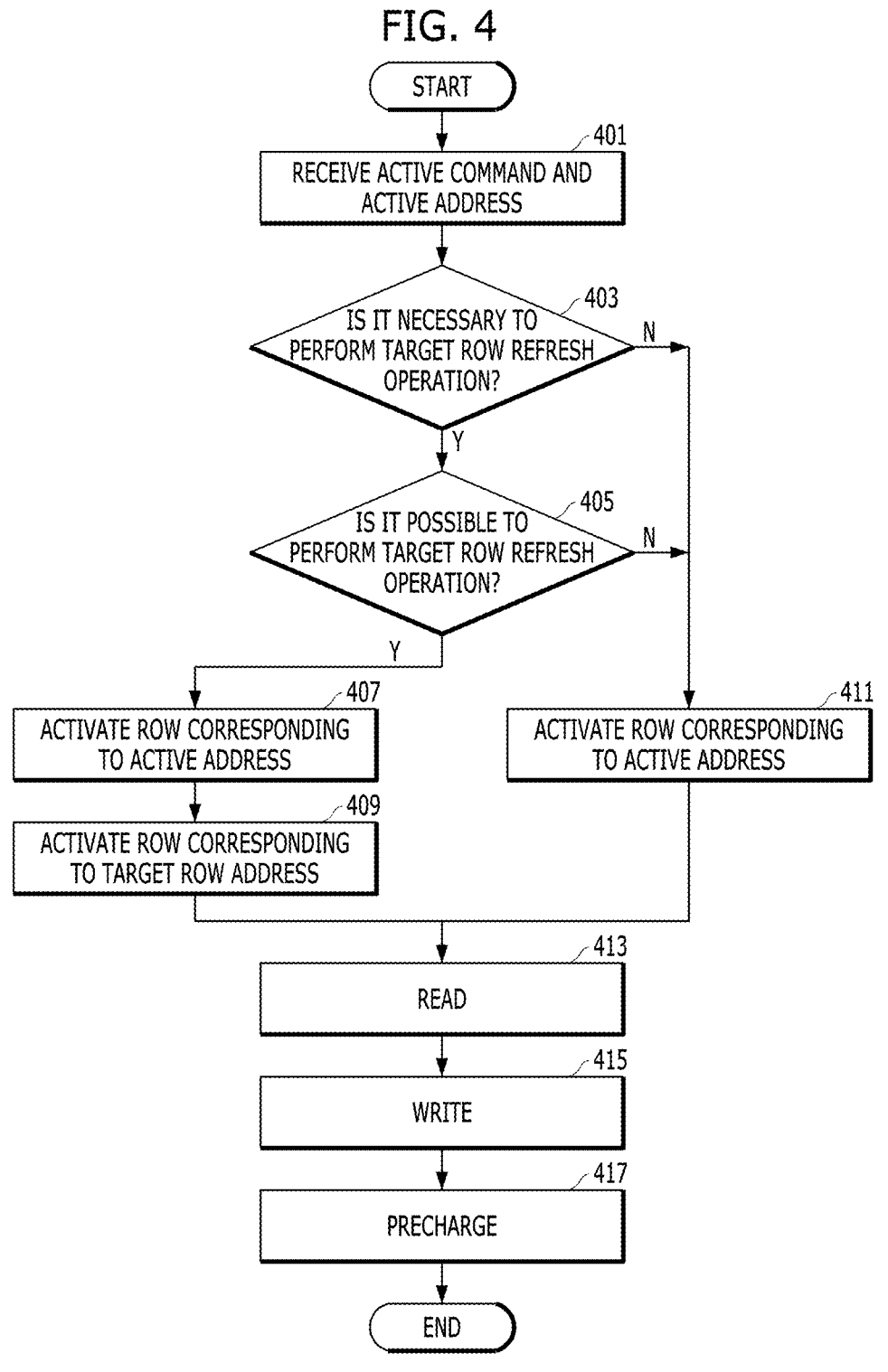
FIG. 4 is a diagram illustrating an operation of the memory in FIG. 2 in accordance with an embodiment of the present disclosure.

FIG. 4 is a diagram illustrating an operation of the memory 200 in FIG. 2 in accordance with an embodiment of the present disclosure.

Referring to FIG. 4, the memory 200 may receive an active command and an active address (a row address for the active operation) (401). The command decoder 210 may activate the active signal ACT, and the address control circuit 220 may classify an address received from the command decoder 210 into the row address R_ADD that is an active address.

The target row refresh operation control circuit 250 may determine whether it is needed to perform the target row refresh operation together with the active operation (403). The target row refresh operation control circuit 250 may use the following two conditions as determination criteria: (1) A condition in which the number of times by which the active command is applied is counted and matches a predetermined value (for example, a multiple of N), the condition being a condition for performing the target row refresh operation whenever the active operation is performed N times; and (2) A condition in which the target row address TARGET- _R_ADD collected by the target row collection circuit 240 exists. When both the conditions (1) and (2) are satisfied, the target row refresh operation control circuit 250 may determine that it is needed to perform the target row refresh operation. Alternatively, according to an embodiment, when the condition (2) is satisfied regardless of the condition (1), the target row refresh operation control circuit 250 may determine that it is needed to perform the target row refresh operation.

When it is determined that it is needed to perform the target row refresh operation ('Y' in 403), the target row refresh operation control circuit 250 may determine the possibility of performing the target row refresh operation (405). In a state in which the row corresponding to the row address R_ADD, which is the active address, is activated in the memory core 260, when it is possible to further activate the row corresponding to the target row address TARGET-_R_ADD, the target row refresh operation control circuit 250 may determine that it is possible to perform the target row refresh operation, and if not, the target row refresh operation control circuit 250 may determine that it is not possible to perform the target row refresh operation. When it is determined that it is possible to perform the target row refresh operation, the target row refresh operation control circuit 250 may activate the target row refresh signal TARGET_REF.

When it is determined that it is not needed to perform the target row refresh operation ('N' in 403) or it is determined that it is not possible to perform the target row refresh operation ('N' in 405), the row corresponding to the active address R_ADD in the memory core 260 may be activated (411).

When it is determined that it is possible to perform the target row refresh operation ('Y' in 405), the row corresponding to the active address R_ADD in the memory core 260 may be activated (407), and the row corresponding to the target row address TARGET_R_ADD may be further activated (409).

A read operation may be performed (413). The read operation may be started when the memory 200 receives a read command and a read address that is a column address C_ADD used in the read operation. During the read operation, data may be read from memory cells of columns selected by the read address C_ADD in a row activated by the active address R_ADD in the memory core 260, and the read data may be transmitted to the memory controller through the data transmission/reception circuit 203. That is, during the read operation, only a row activated by the active address R_ADD in the memory core 260 may be accessed, and a row activated by the target row address TARGET-_R_ADD may not be accessed. For example, when one row is activated in the cell arrays 310_0 and 310_1 by the active address R_ADD and one row is activated in the cell arrays 310_6 and 310_7 by the target row address TARGET-_R_ADD, the bus switch arrays 330_0 to 330_3 corresponding to the cell arrays 310_0 and 310_1 may be activated and may operate, but the bus switch arrays 330_6 to 330_9 corresponding to the cell arrays 310_6 and 310_7 may be deactivated and may not operate during the read operation.

A write operation may be performed (415). The write operation may be started when the memory 200 receives a write command, a write address that is a column address C_ADD used for the write operation, and write data. During the write operation, write data may be written to memory cells of columns selected by the write address C_ADD in a row activated by the active address R_ADD in the memory core 260. That is, during the write operation, only a row activated by the active address R_ADD in the memory core 260 may be accessed, and a row activated by the target row address TARGET_R_ADD may not be accessed.

A precharge operation may be performed (417). When the memory 200 receives a precharge command, the precharge operation, in which a row activated in the memory core 260 is deactivated, may be performed.

Figure 5:
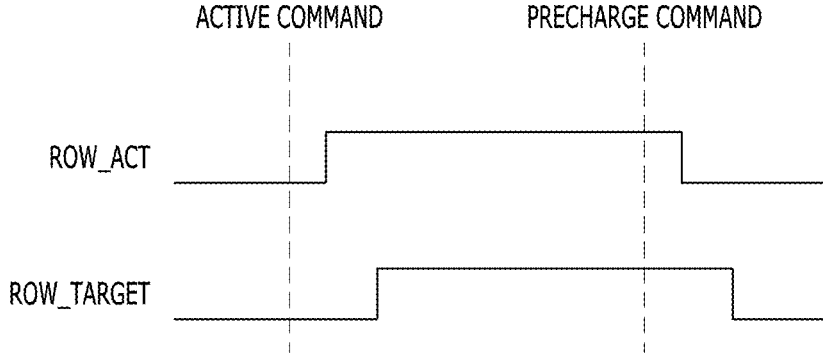
FIG. 5 is a diagram illustrating a timing at which a row corresponding to an active address is activated in FIG. 4 and a timing at which a row corresponding to a target row address is activated in FIG. 4 in accordance with an embodiment of the present disclosure.

FIG. 5 is a diagram illustrating a timing at which a row ROW_ACT corresponding to the active address is activated (407) in FIG. 4 and a timing at which a row ROW_TARGET corresponding to the target row address is activated (409) in FIG. 4.

Referring to FIG. 5, the row ROW_ACT corresponding to the active address R_ADD may be first activated for timing separation, and the row ROW_TARGET corresponding to the target row address TARGET_R_ADD may be activated after a predetermined delay. Furthermore, even in the precharge operation, the row ROW_ACT corresponding to the active address may be first precharged for timing separation, and the row corresponding to the target row address ROW_TARGET may be precharged after a predetermined delay.

According to embodiments of the present disclosure, a target row refresh operation may be performed together with an active operation during the active operation. Accordingly, a target row refresh operation may be frequently performed, and thus, the possibility of data loss due to row hammering of the memory may be reduced.

Although the technical spirit of the present disclosure has been specifically described according to the above embodiments, it should be noted that the above embodiments are for description, and are not for its limitation. Furthermore, those who skilled in the art will understand that various embodiments can be made within the scope of the technical spirit of the present disclosure and the following claims. Furthermore, the embodiments may be combined to form additional embodiments.

What is claimed is:

1. A memory comprising:
   memory cell arrays, neighboring ones of which share a corresponding one of bit line sense amplifier arrays coupled to columns of the respective memory cell arrays;
   a data transfer circuit configured to exchange data with an exterior;
   switch arrays each configured to couple, when activated, the data transfer circuit to at least one of bit line sense amplifiers within a corresponding one of the bit line sense amplifier arrays; and
   a control circuit configured to:
   activate, during an active operation, first and second rows of respective first and second memory cell arrays that do not neighbor with each other among the memory cell arrays, and
   access the activated first row by activating a first switch array while deactivating a second switch array, the first and second switch arrays respectively corresponding to the first and second memory cell arrays.

2. The memory of claim 1, wherein the activated second row is not accessed while accessing the activated first row.

3. The memory of claim 1, wherein the control circuit is configured to:
   select the first row according to an active address input from the exterior during the active operation, and
   select the second row according to a target row address when it is determined to perform a target row refresh operation during the active operation.

4. The memory of claim 3, wherein the control circuit is further configured to:

determine whether to perform the target row refresh operation during the active operation, by determining, whenever an active command is applied a predetermined number of times, whether the target row address is collected or not.

5. The memory of claim 3, further comprising:

a target row collection circuit configured to collect the target row address based on the active address or collect the target row address by random sampling.

6. The memory of claim 1, wherein the control circuit is configured to:

read, in response to a read command and a read address, data from memory cells selected by the read address in the activated first row.

7. The memory of claim 1, wherein the control circuit is configured to:

write, in response to a write command and a write address, write data to memory cells selected by the write address in the activated first row.

8. The memory of claim 3, wherein the control circuit is configured to:

precharge, after the active operation, the activated first row and the activated second row, in response to a precharge command.

9. An operating method of a memory including memory cell arrays, neighboring ones of which share a corresponding one of bit line sense amplifier arrays coupled to columns of the respective memory cell arrays, and switch arrays each configured to couple, when activated, a data transfer circuit to at least one of bit line sense amplifiers within a corresponding one of the bit line sense amplifier arrays, the operating method comprising:

activating, during an active operation, first and second rows of respective first and second memory cell arrays that do not neighbor with each other among the memory cell arrays; and accessing the activated first row by activating a first switch array while deactivating a second switch array, the first and second switch arrays respectively corresponding to the first and second memory cell arrays.

10. The operating method of claim 9, wherein the activated second row is not accessed while accessing the activated first row.

11. The operating method of claim 9, wherein the activating the first and second rows includes:

selecting the first row according to an active address input from an exterior during the active operation, and selecting the second row according to a target row address when it is determined to perform a target row refresh operation during the active operation.

12. The operating method of claim 11, wherein the activating the first and second rows further includes:

determining whether to perform the target row refresh operation during the active operation, by determining, whenever an active command is applied a predetermined number of times, whether the target row address is collected or not.

13. The operating method of claim 11, further comprising:

collecting the target row address based on the active address or collecting the target row address by random sampling.

14. The operating method of claim 9, further comprising:

receiving a read command and a read address; and reading, after accessing the activated first row, data from memory cells corresponding to the read address in the activated first row.

15. The operating method of claim 9, further comprising:

receiving a write command, a write address and a write data; and writing, after accessing the activated first row, the write data from memory cells corresponding to the read address in the activated first row.

16. The operating method of claim 9, further comprising:

receiving a precharge command; and precharging, after the activation operation, the first row and the second row, in response to the precharge command.

* * * * *